United States Patent [19]
Ruby

[11] Patent Number: 5,208,213
[45] Date of Patent: May 4, 1993

[54] VARIABLE SUPERCONDUCTING DELAY LINE HAVING MEANS FOR INDEPENDENTLY CONTROLLING CONSTANT DELAY TIME OR CONSTANT IMPEDANCE

[75] Inventor: Richard C. Ruby, Menlo Park, Calif.

[73] Assignee: Hewlett-Packard Company, Palo Alto, Calif.

[21] Appl. No.: 864,429

[22] Filed: Apr. 12, 1991

[51] Int. Cl.$^5$ .................. H01P 9/00; H03H 11/16; H01B 12/02
[52] U.S. Cl. ..................... 505/1; 505/700; 505/701; 505/866; 333/18; 333/99 S; 333/161
[58] Field of Search ............ 333/99 S, 161, 164, 333/156, 139, 18; 505/1, 700, 701, 866

[56] References Cited

U.S. PATENT DOCUMENTS

| | | | |
|---|---|---|---|
| 3,290,624 | 12/1966 | Hines | 333/164 |
| 3,344,366 | 9/1967 | Ngo | 333/18 X |
| 3,355,681 | 11/1967 | Beurrier et al. | 333/18 X |
| 3,521,198 | 7/1970 | Shahbender | 333/156 |
| 3,543,192 | 11/1970 | Rowe et al. | 333/18 X |
| 3,778,643 | 12/1973 | Jaffe | 333/161 X |

FOREIGN PATENT DOCUMENTS 357507 3/1990 European Pat. Off. ............ 505/701
239104 11/1985 Japan .................................. 333/164

OTHER PUBLICATIONS

E. Track et al., "Modulation of the Penetration of Nb and NbN Films by Quasiparticle Detection", I.E.E.E. Transactions on Magnetics, vol. 25, 1989, p. 1096.
E. Track et al., I.E.E.E. Proceedings, "Transaction on Magnetics", vol. 27 1991.
G. Rupprecht et al., *Phys. Rev.* vol. 125, No. (6), 1962, pp. 1915–1920.

*Primary Examiner*—Robert J. Pascal
*Assistant Examiner*—Benny T. Lee

[57] ABSTRACT

A variable superconducting delay line system and method having a high temperature superconducting trace and ground plane characterized by a variable inductance L per unit length and capacitance C per unit length, wherein the system and method permit users to select a delay time for an incoming signal propagating through a the transmission line. The system is adapted to keep the ratio of L/C constant, while independently changing L and C to achieve the desired delay time, which corresponds to the product of L times C.

15 Claims, 7 Drawing Sheets

VARIABLE SUPERCONDUCTING DELAY LINE HAVING MEANS FOR INDEPENDENTLY CONTROLLING CONSTANT DELAY TIME OR CONSTANT IMPEDANCE

BACKGROUND OF THE INVENTION

1. Field of the Invention

The field of the invention relates generally to superconducting transmission delay lines which may be used to keep a constant electrical delay length or maintain a constant impedance. More particularly, the invention relates to a system and method permitting users to adjust a variable superconducting transmission line incorporating feedback loops to achieve a precise electrical delay length or an impedance value.

2. Related Art

A typical delay line used at RF and microwave frequencies is a trombone line with a mechanically variable slide. As part of the line slides along with respect to the other line (the fixed line), the delay line length increases. Ideally, the impedance will stay constant and the electrical length will be fixed. In reality, however, there is always some small amount of impedance mismatch. The electrical length is seldom constant due to mechanical stresses and temperature variations. Lastly, the trombone delay line is a large bulky device which requires machining and is expensive to manufacture.

As can be seen from E. Track et al.'s paper titled, "Modulation of the Penetration of Nb and NbN Films by Quasiparticle Detection", (I.E.E.E. Transactions on Magnetics, Vol. 25, 1989, pg. 1096), superconductive traces can give rise to a controllable inductor.

SUMMARY OF THE INVENTION

The present invention is directed to a variable superconducting transmission line system and method having a high temperature superconducting trace and ground plane characterized by a variable inductance L per unit length and capacitance C per unit length. The system permits users to select a delay time for an incoming signal propagating through the system. The system comprises means for maintaining the ratio of L/C to be substantially constant and means for independently changing L and C to achieve the delay time, which corresponds to the product LxC, while maintaining said ratio L/C substantially constant.

The present invention is also directed to a variable superconducting delay line system and method which permits a user to launch a signal into the transmission line and select a delay time for the propagation of the signal through the transmission line. Alternatively, the user may select the impedance value of the delay line itself. The system comprises an insulating substrate for supporting a high temperature superconducting trace (high $T_c$ YBCO, for example) and a ground plane. The trace includes an input for applying a signal to the system, as well as an output for deriving the delayed signal. In addition, the system includes control means for independently controlling the capacitance and inductance of the trace to thereby delay the signal or yield a system impedance according to the user's selection.

BRIEF DESCRIPTION OF THE DRAWINGS

The invention will be better understood if reference is made to the accompanying drawings in which.

In the drawings, like reference numbers indicate identical or functionally similar elements. Additionally, the left-most digit of the reference number identifies the drawing in which the reference number first appears.

DETAILED DESCRIPTION OF THE PREFERRED EMBODIMENTS

The variable superconducting delay line system and method of the present invention (the "present invention") utilize the temperature dependence of a dielectric substrate to change the capacitance of a high temperature superconducting delay line. In addition, the present invention uses photon or quasiparticle injection to control the inductance of the delay line. The capacitance and inductance of the delay line are separately controllable to yield a changeable electrical delay length or impedance. As a result, the present invention has a plethora of RF and/or microwave frequency applications.

The preferred embodiment of the delay line comprises a meandering trace of high temperature superconducting material. Three separate circuits are employed to achieve an accurate and stable electrical delay length or impedance for the delay line. A microprocessor or equivalent control circuit may be used to monitor and control the system and method as a whole.

Figure 1:
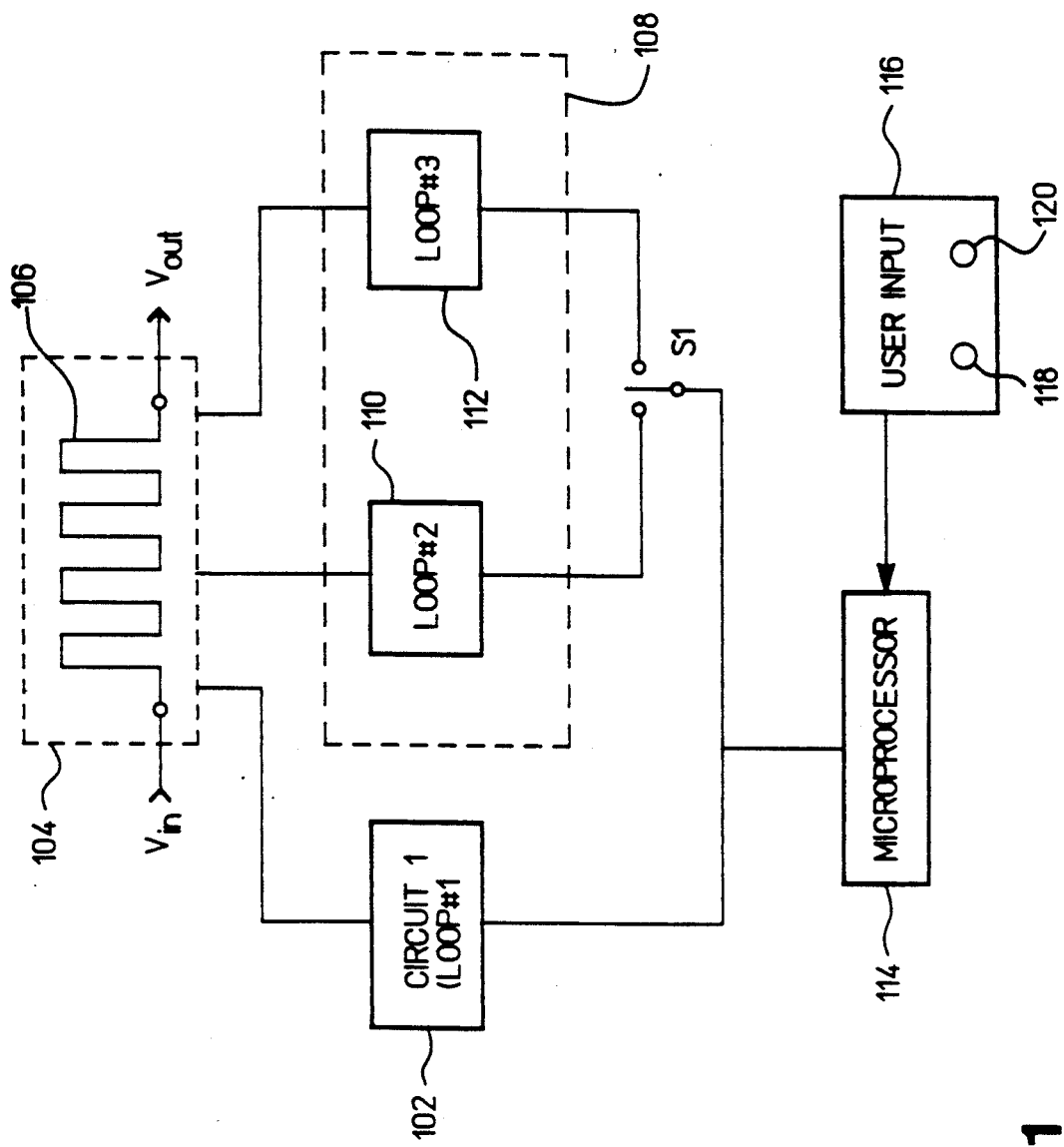
FIG. 1 shows a high level block diagram of the superconductive delay line in connection with the present invention.

FIG. 1 shows a high level bock diagram of an embodiment of the present invention. A first circuit 102 is used to monitor and control the temperature of a substrate 104 (shown in FIG. 1 as a phantom box). A meandering trace (i.e., a high temperature super-conducting delay line) 106 is formed on the substrate 104. Circuit 102 includes a feedback loop #1 as a control mechanism. The dielectric substrate strontium titanate is strongly temperature dependent near its Curie temperature. The capacitance of the superconducting delay line can be varied by adjusting the temperature of the strontium titanate substrate. A look-up table can be programmed into the microprocessor that maps a particular capacitance value of the strontium titanate substrate to a given electrical delay length of the superconducting delay line.

A second circuit 108 is used to control the emission of photons onto the delay line to adjust its inductance. A general discussion regarding this general principle can be found in E. Track e al., I.E.E.E. Proceedings, *Transaction on Magnetics*, 1991, Vol. 27 and 1989, Vol. 25.

The second circuit includes two feedback loops, loops #2 and #3, (see 110 and 112 of FIG. 1, respectively), which perform two separate, but related functions. Loop #2 is used to change the inductance and maintain the delay line's impedance at 50Ω (ohms) during the time the capacitance is changing to obtain the desired delay time. Loop #3 is then used to adjust the inductance of the delay line to achieve and keep steady the user specified delay time.

The delay line 106 includes an input to receive an electrical signal shown at $V_m$ and an output labeled $V_{out}$. The delay of a signal propagating through the delay line 106 will primarily depend on the length of the trace, the inductance per unit length and the capacitance per unit length of the delay line, as will be discussed below.

The three loops, loops #1, #2 and #3, employ active feedback mechanisms under the control of or monitored by a microprocessor 120. Loops #2 and #3 are not used simultaneously, because of system constraints (i.e., system stability would be compromised if both circuits attempted to adjust the inductance of the delay line at the same). A general switching mechanism S1 is shown at FIG. 1 to emphasize this point. However, loops #2 and #3 could be directly controlled by the microprocessor 120. The microprocessor 120 may be a general purpose or personal computer, for example, or any equivalent control system commonly used and known to those of skill in the art.

The system and method of the present invention thus permit the user to control either an electrical delay length or an impedance value by separate manipulation of (1) a capacitance value, and (2) an inductance value. An example user input device is shown at 116. The user input device 116 sends user specified instruction to the microprocessor 120. The user input device, however, is not part of the present invention.

Changing the capacitance value or the inductance value does not cause first order effects to the other. For example, the injection of photons into the substrate will change its temperature a small amount. However, this is a second order effect and does not appreciably change the capacitance of the delay line. Likewise, small variations in substrate temperature will only affect inductance a small amount if the mean range of temperatures are far from the critical temperature of the superconductor, (i.e., one half or less of the critical temperature). Hence, the processes of changing the delay line's capacitance and inductance are essentially decoupled from one another.

The user input device 116 includes a control knob 118, such as a potentiometer or keyboard, for specifying a desired time delay. Another control knob 114, for example a switch, may be used so that the user can request that the delay line be kept at a constant impedance. The user input device 116 is only an example of the way a user may input information. Any number of input devices could be used as will become evident to those of skill in the art.

A user must first select a desired delay time to operate the present invention. The user must accept a minor tradeoff between exact delay time and constant delay line impedance. The user has the option to maintain an exact delay length while sacrificing a small amount of impedance fluctuation in the delay line. Alternatively, the user can maintain an exact impedance and sacrifice the accuracy of the delay time itself. These tradeoffs are not substantial, because the impedance can be periodically adjusted by the user while maintaining a very accurate delay time. Periodic adjustment of the delay line's impedance can also be controlled by the microprocessor 120.

Figure 2:
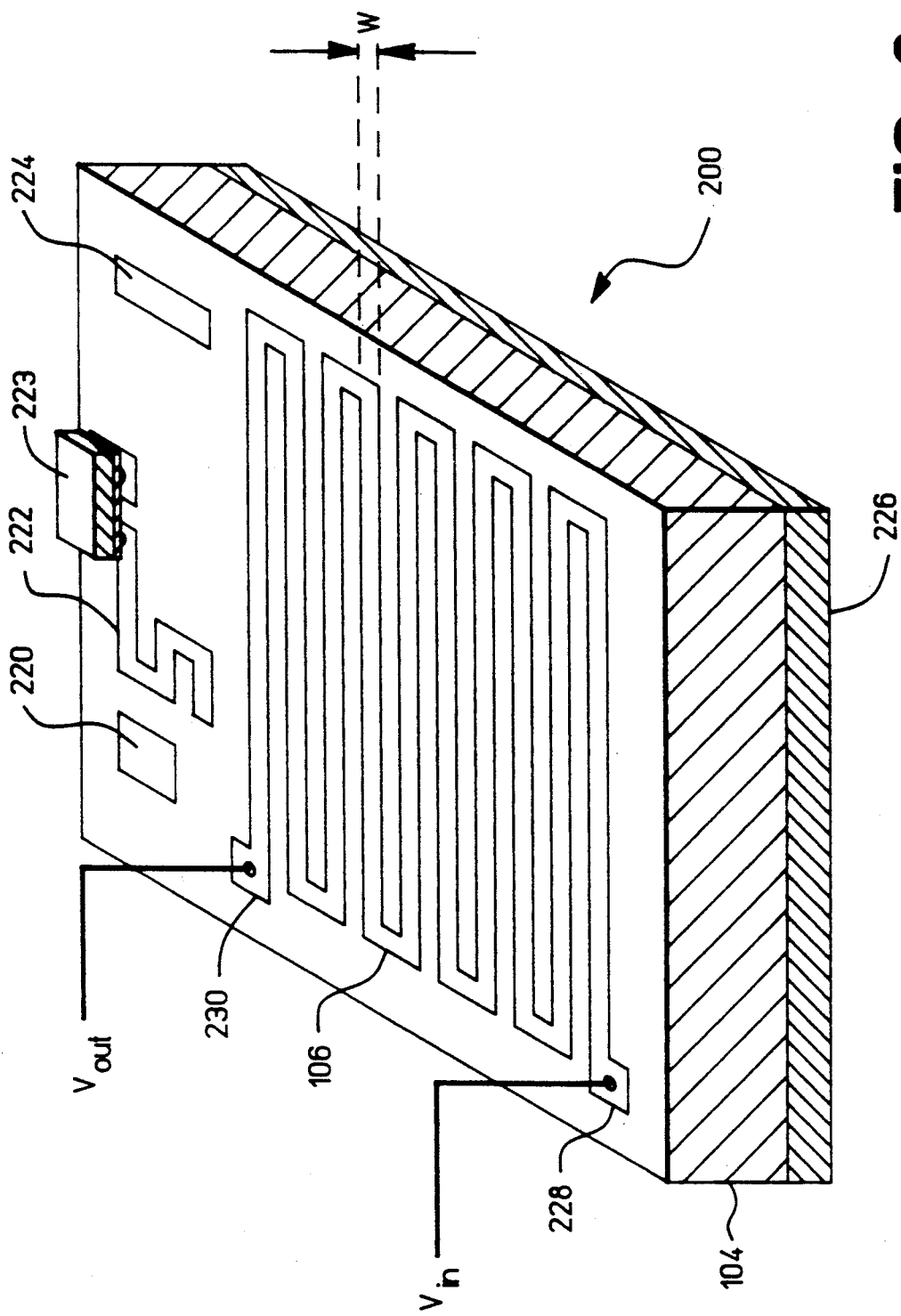
FIG. 2 shows a substrate supporting the superconductive delay line in connection with the present invention.

Referring now to FIG. 2, a chip 200 includes the substrate 104, such as strontium titanate, for supporting the following: a meandering trace (i.e., delay line 106), a capacitive pad 220, a dummy delay line 222, a small resonator 224 and a ground plane 226 on the back side of the substrate. These five elements are formed of a superconducting material such as yttrium barium copper oxide (YBCO) patterned to a thickness of approximately 0.2 μm (microns) on the dielectric (insulating) substrate 104 using conventional techniques, such as sputtering or chemical vapor deposition (CVD). The ground plane 226 of YBCO (approximately 0.2 μm thick) is formed on the back side of the substrate 104 (the ground plane may alternatively be formed in a co-planar fashion). Other so called high $T_c$ compounds such as the thallium compounds or any of the rare earth compounds would also work as long as the critical temperature of the superconductor is at least two times higher than the Curie temperature ($T_{curie}$) of the substrate.

The dielectric substrate 104 is formed of strontium titanate ($SrTiO_3$), having a thickness of approximately 100 μm and a surface area of approximately one square cm. The substrate may alternatively be formed of any perovskite material that goes through a Curie phase transition at a temperature $T_{curie}$ that is less than or equal to about one half of $T_c$ of the superconductor.

The meandering delay line 106 includes an input 228 to receive an electrical signal $V_m$. An output electrical signal $V_{out}$ is derived from an output terminal 230. The length of the delay is application specific, but may range between approximately 1 and 10 cm, for example.

The trace width (shown at "W" in FIG. 2) of the delay line 106, the dummy delay line 222 (a few wavelengths in length) and the resonator 224 is approximately 25 μm. With an impedance of 50Ω, a trace width of 25 μm and a thickness of 0.2 μm, the delay line can withstand an input voltage $V_m$ of approximately 50 volts, for example, at a current of about 1 amp (this assumes current densities on the order of $2 \times 10^7$ amps/cm$^2$ for superconducting compounds). However, lower input operating currents are desirable.

As discussed above, the delay of a signal propagating through the superconducting trace/delay line 106 will primarily depend on the length of the trace and the value of capacitance per unit length and inductance per unit length. The present invention can input delay signals ranging from approximately 100's of MHz to a few GHz. Hence, the percent amount delay of depends on the wavelength of the input signal.

The capacitive pad 220 is used in feedback loop #1 to monitor and adjust the capacitance of the substrate 104, and is associated with the circuit 102. The circuit 102 is discussed below with reference to FIG. 4.

The dummy delay line 222 is used in a feedback loop #2 which also includes a time domain reflectometer or, alternatively, a VSWR meter for measuring reflections in the dummy delay line 222. A 50Ω surface mount-type (SMT) resistor 223 is "flip-chip" mounted at one end of the dummy delay line 222 to act as a load, as shown in FIG. 2. (The other connection to the resistor must be connected to ground. Flip-chip mounting resistors to substrates via solder bumps is a well known technique. The solder bump lead will introduce some reactance (hence, the VSWR meter will never go to zero). However, one can still find an appropriate inductance for a given capacitance that will minimize the VSWR meter. The VSWR meter will adjust the inductance of the dummy delay line to minimize the reflections at the electrical interface with the resistive load. The transmission line impedance which is desired to be maintained will thus depend on the value of the resistive load chosen by the user.

Figure 6:
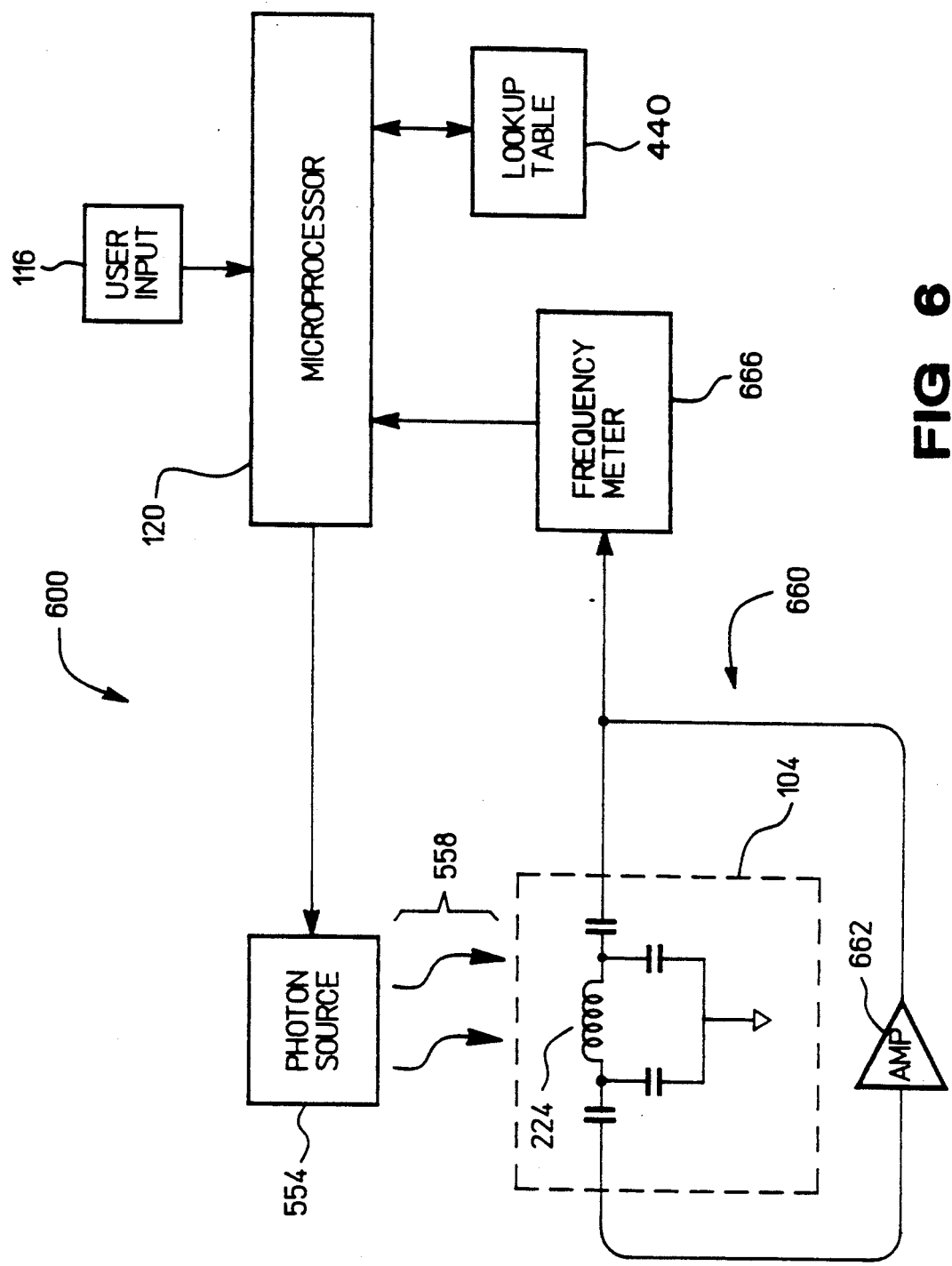
FIG. 6 shows a block diagram of a resonator control circuit in connection with the present invention (loop #3).

When activated, the loop #2 maintains a constant delay line impedance of 50Ω (corresponding to a resistive load of 50Ω, for example). If reflections are detected in the dummy delay line 222 by the VSWR meter, the VSWR meter outputs a signal to a photon source. The photon source, a laser for example, is switched on to adjust the inductance of the delay line accordingly. The dummy delay line 222 and VSWR meter are discussed below with reference to FIG. 6.

Once the user specified delay length is obtained, a resonator circuit is switched on. The resonator circuit includes a resonator 224 and feedback loop #3. Loop #3 monitors the inductance of the resonator 224 employed in the resonator circuit. Loop #3's primary function is to maintain the user specified delay length. (Note that loop #2 is turned off before loop #3 is invoked. In operation, loops #2 and #3 may be periodically interleaved.) Resonator 224 and feedback loop #3 are discussed below with reference to FIG. 5.

The dielectric properties of $SrTiCO_3$ are temperature dependent. The Curie temperature ($T_{curie}$) of $SrTiO_3$ is approximately 37° K. which is far away from the $T_c$ of the high $T_c$ superconductors such as YBCO. This is a very important consideration. At temperatures far from the $T_c$ of superconductors (i.e. 50% or less of $T_c$) the penetration depth as well as other superconducting parameters, such as the superconducting gap, vary slowly with respect to temperature. This is in contrast to the situation where the temperature is near $T_c$ and all superconducting parameters vary sharply with temperature.

The Curie temperature of $SrTiCO_3$ being 37° K. places the logical operating temperature of this invention in the range of 37° to 42° K. and far from the $T_c$ of YBCO which is approximately 95° K.

Figure 3:
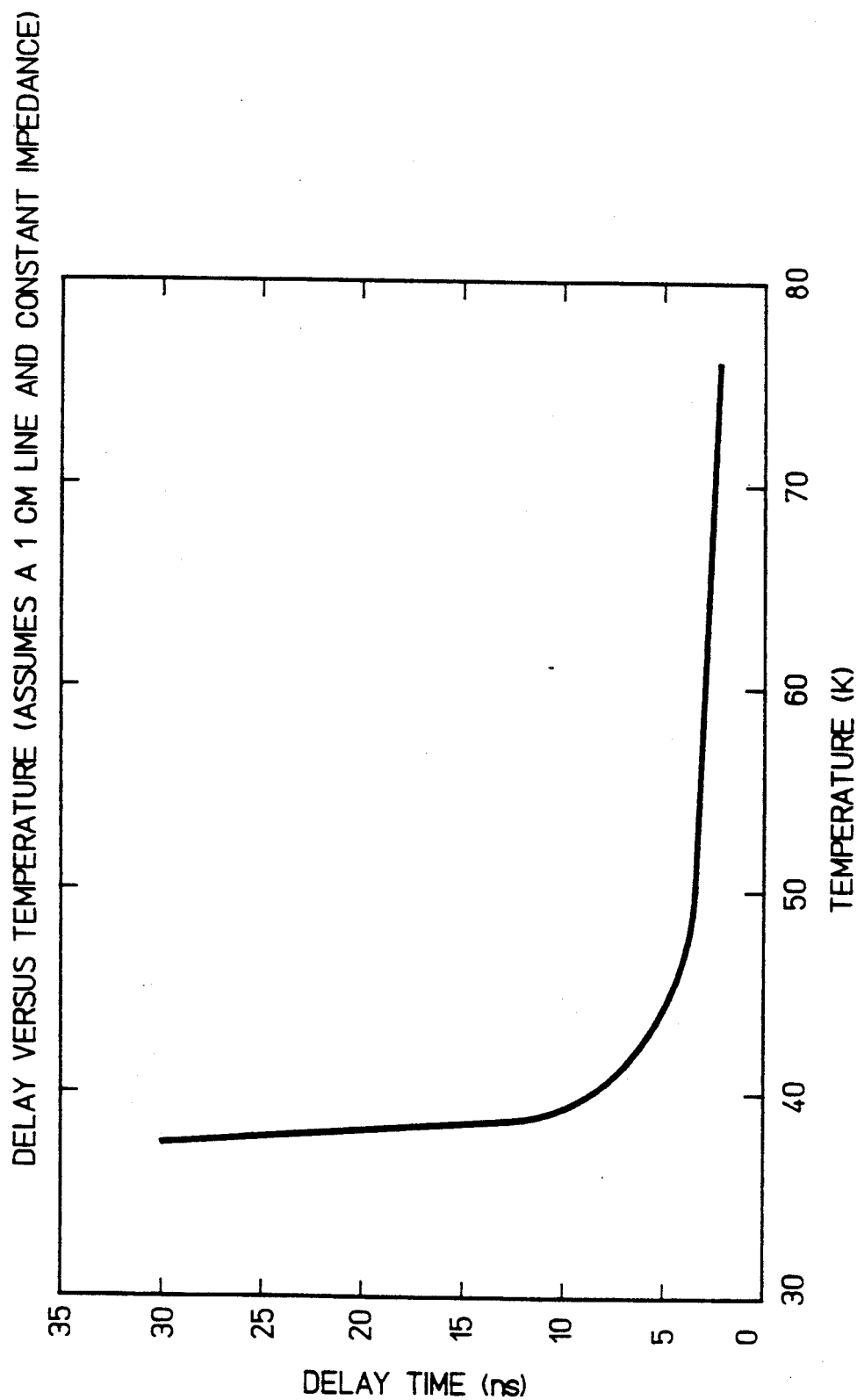
FIG. 3 shows a Delay Time vs. Temperature plot for strontium titanate.

For the $SrTiO_3$, the dielectric is dependent upon temperature (T) as follows:

$$\epsilon(T) = \epsilon_0 \frac{C}{T - T_{curie}} \quad T > T_{curie} \qquad (1)$$

where $T_{curie}$ is the Curie temperature and is equal to 37.0° K. for $SrTiO_3$, C=82,500° K., and $\epsilon_0 = 8.85 \times 10^{-14}$ Farads/cm. FIG. 3 shows a Delay Time vs. Temperature plot for strontium titanate. (See G. Rupprecht and Bell, *Phys.Rev.* 125(6):1915-1920, (1962), for a further explanation of this dependency).

Recall that capacitance C is equal to:

$$\epsilon(T) \frac{area}{thickness} \qquad (2)$$

and that the following is the characteristic impedance (Z0) of a lossless or nearly lossless device:

$$Z_0 = \sqrt{\frac{L}{C}} \qquad (3)$$

For thin superconductors, where d is less than λ (d being the thickness of the trace and λ is the penetration depth of the superconductor) the inductance L can be shown to be proportional to $\lambda^2$.

$$L = \frac{\mu_0 \lambda^2}{Wd} \qquad (4)$$

where W is the width of the superconductor and $\mu_0$ is the permeability of free space ($4\pi \times 10^{-7}$ H/m). In turn, λ is shown to be proportional to:

$$\lambda(n) = \frac{\lambda(0)}{1 - 2n} \qquad (5)$$

where n is the out-of-equilibrium density of quasiparticles normalized to the density of superconducting particles λ(0). The out of equilibrium density n is directly affected by the number of photons incident on the superconducting material.

The velocity v is proportional to:

$$v = \frac{1}{\sqrt{LC}} \quad \frac{cm}{sec} \qquad (6)$$

where L and C are the inductance and capacitance per unit length. The delay is the length of the delay line divided by v.

$$\text{Delay Time} = \frac{\text{length of line}}{v} \qquad (7)$$

The frequency f of the resonator circuit used to fix L and C and thus fix the electrical length (i.e., the delay time) is equal to:

$$\frac{1}{\sqrt{LC}} hz \qquad (8)$$

Here, L and C are lumped values.

For the impedance match/mismatch, the VSWR meter is a measure of the amount of reflected power to incident power.

If the impedances are matched, then:

$$VSWR = \frac{1 + |\rho|}{1 - |\rho|} = 0 \qquad (9)$$

where $$\rho = \frac{Z_1 - Z_0}{Z_1 + Z_0} \qquad (10)$$

Where $Z_1$ is a load resistor placed at one end of the line (referred to above as the flip-chip resistor).

Figure 4:
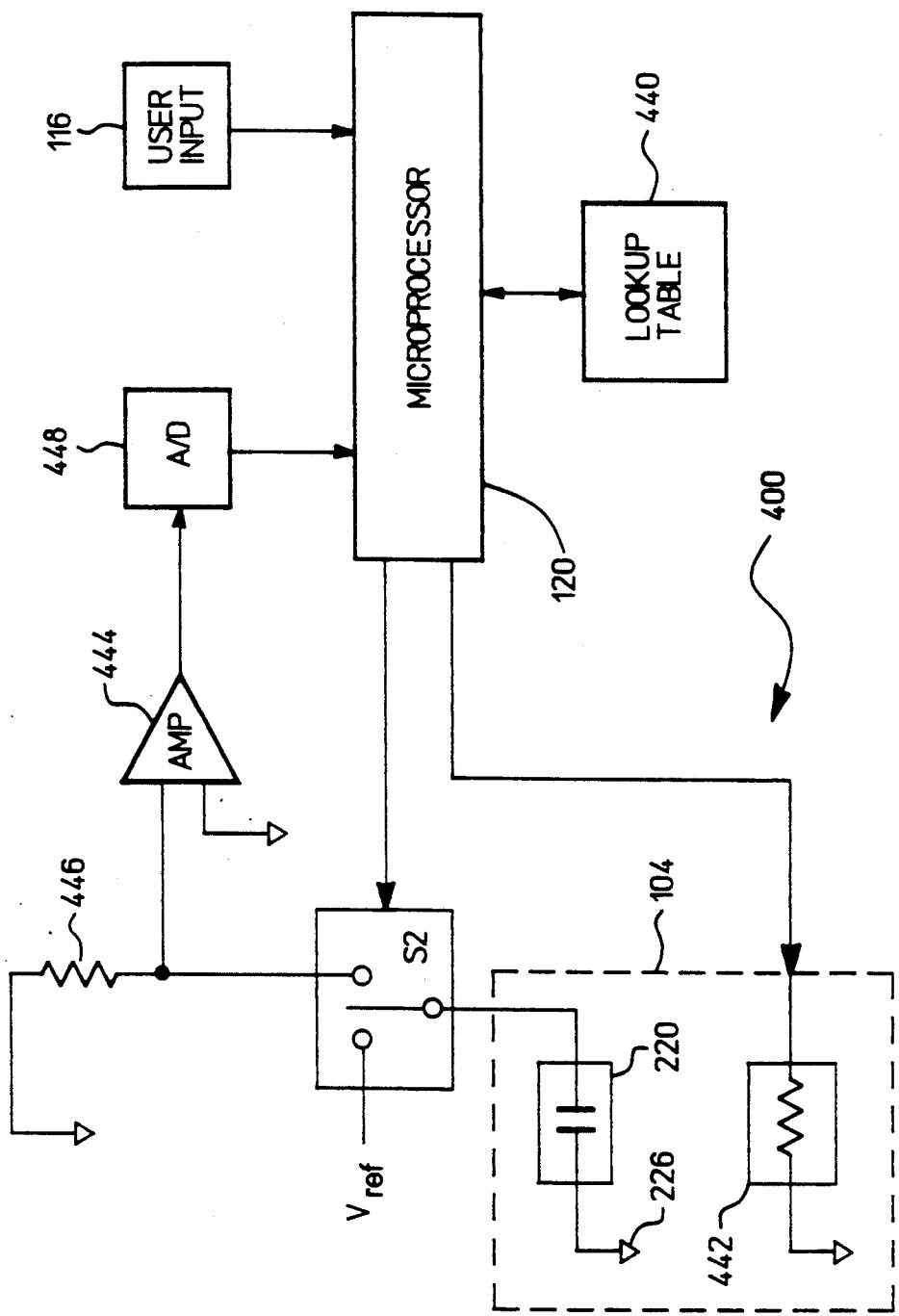
FIG. 4 shows a block diagram of a capacitance control circuit in connection with the present invention (loop #1).

FIG. 4 shows a block diagram of the superconducting capacitor 220 and feedback loop #1 (shown at 400) in connection with the present invention.

A capacitive pad 220 is formed of high temperature superconductive material, such as yttrium barium copper oxide (YBCO). The capacitance of the pad 220 can be changed, because the dielectric of the underlying substrate is directly proportional to temperature. The high temperature superconducting capacitive pad 220 is patterned in a simple pad-like, or rectangular, shape of known dimensions by a known method.

Based on the above described temperature dependant properties of the substrate, and the known dimensions of the pad 220, the capacitance of the pad 220 can be determined. The capacitance of the pad 220, and more importantly the capacitance of the delay line 106 can be adjusted by changing the temperature of the underlying substrate 104 (e.g., SrTiCO$_3$) by use of a heater 442 (not shown in FIG. 2).

The heater 442 may be a common resistive heating element. It is important to note that temperature is maintained using vapor phase as the cooling agent and a copper block as a local heating element (there can be several variations on this scheme; the details of the heater are not necessary for carrying-out the present invention). The heater 442 is part of a feedback loop #1 shown at 400. A Cambridge Instruments Heliotran or any other commonly known vapor phase cooling device may be used.

Feedback loop #1 is used to maintain temperature control of the substrate 104 and the capacitance associated with the superconducting capacitive pad 220 and the delay line 106. The measured capacitance is compared to a look up table 440 and the temperature is adjusted accordingly.

The lookup table 440 contains information relating delay time versus capacitance of the delay line 106. The microprocessor 120, in conjunction with feedback loop #1, adjusts the substrate heater 442 to maintain the temperature/capacitance of the delay line 106 at a value associated with the user-chosen time delay value (via user input device 116 discussed in conjunction with FIG. 1 above). The voltage of the capacitive pad 220 is referenced to the superconducting ground plane 226, which is also the ground plane for the delay line/meander trace.

One method for measuring the capacitance is by charging the capacitive pad 220 to a reference voltage $V_{ref}$ via switch S2. The switch may be controlled by the microprocessor 120 to discharge the capacitive pad 220 through a resistor 446. The exponentially delaying voltage at the capacitive pad 220 is converted to a linear voltage signal by a logarithmic amplifier 444.

The linear signal is sent to an analog-to-digital converter 448 which converts the linearized voltage signal into a corresponding digital value. The A/D converter 448 sends the digitized value to the microprocessor 120.

Feedback loop #1 (including the microprocessor 120) controls the power sent to the heater 442, and thus the temperature of the substrate 104 and the capacitance of the capacitive pad 220 and the delay line 106. Thus, the user specified delay time can be changed by adjusting the capacitance of the delay line via he control mechanism described above and referred to as feedback loop #1.

The injection of photons into the YBCO elements changes the value of quasiparticles and, hence, the penetration depth to first order, but only affects the temperature to second order, if at all. This is used in feedback loops #2 and #3 to adjust the inductance of the delay line to maintain a constant electrical length (i.e., a time delay) or a constant impedance.

Figure 5:
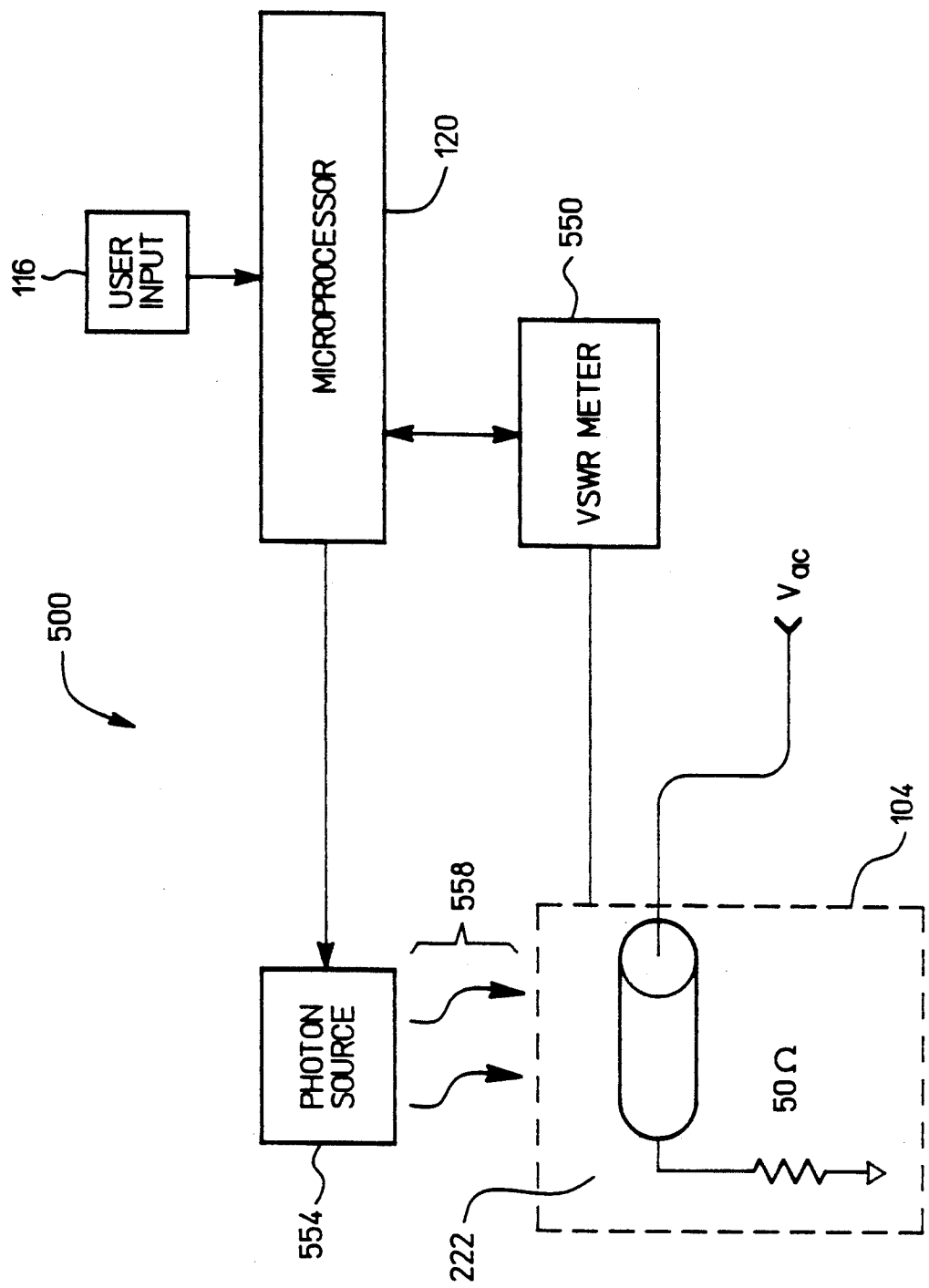
FIG. 5 shows a block diagram of a constant impedance control circuit in connection with the present invention (loop #2).

FIG. 5 shows a block diagram for a fixed impedance circuit which includes feedback loop #2 labeled 500. If the user desires a fixed impedance, a dummy delay line 222 coupled to a reference voltage Vac terminated with a 50Ω load can be used with a time domain reflectometer 550 or a VSWR meter (the VSWR meter is shown in FIG. 5). The VSWR indicator 550 monitors reflections in the dummy line 222 and adjusts the inductance of the dummy line 222 such as to minimize any reflections.

Feedback loop #2 also adjusts the number of photons 558 incident on the delay line 106, and the dummy load 550. A 50Ω transmission line impedance is maintained while the capacitance is varied (via the heater).

After reaching the equilibrium temperature associated with a given delay the constant impedance loop #2 is disabled and feedback loop #3 is turned on. Feedback loop #3 (shown at 600 in FIG. 6), includes a half-wave length resonator 660. The resonator is basically a small trace on the same substrate 104, but spatially isolated from the delay line 106, as shown at FIG. 2). An amplifier 662 is used to form an oscillator with gain. The resonant frequency is determined by the length of the half-wave length resonator 660. The other elements of feedback loop #3 are a photon source 554, a microprocessor 120 (typically a single microprocessor can be used to control the entire variable superconducting delay line apparatus; see FIG. 1), and a frequency counter 556.

The output signal of the oscillator is fed into the frequency counter 556. The frequency counter 556 samples the frequency of the resonator circuit 660 and outputs a signal to the microprocessor 120. Negative feedback loop #3 is used to adjust the inductance via the photon source 554 to keep the resonant frequency constant. Hence, a stable delay time is obtained.

The photon source 554 may be a common laser or photo diode. As will become evident to those of skill in the art, the laser must emit energy with the above described characteristics of affecting the inductance of high $T_c$ superconducting materials.

Alternatively, quasiparticles can be injected into the delay line and resonator to change their inductance. In such an embodiment, a MgO insulator is deposited on top of the superconducting trace, the dummy delay line and resonator. (Other suitable insulators may be used.) A metal layer is then formed on the insulating layer. These layers are processed in a known manner. A contact lead is established from the top layer metal to a current controlled current source. (A voltage controlled current source may also be employed.) A small penalty is incurred using this approach. The delay line must now be D.C. isolated from the input and output lines. Alternatively, RF blocks must be placed on the D.C. bias leads of the injecting metal layer. This isolation must be configured to prevent the input signal from taking an incorrect path other than the delay line/meander trace.

Due to the unusually low density of states in the superconductor, the perturbation of the ratio of quasiparticles and superconducting paired electrons will be quite pronounced in view of the above outlined structure (see the above equations for details of inductance L vs. injected current). Hence, feedback loop #3 would control the increase or decrease of current applied to the metal layer to change the inductance of the delay line 106 and small resonator 224, accordingly.

Figure 7:
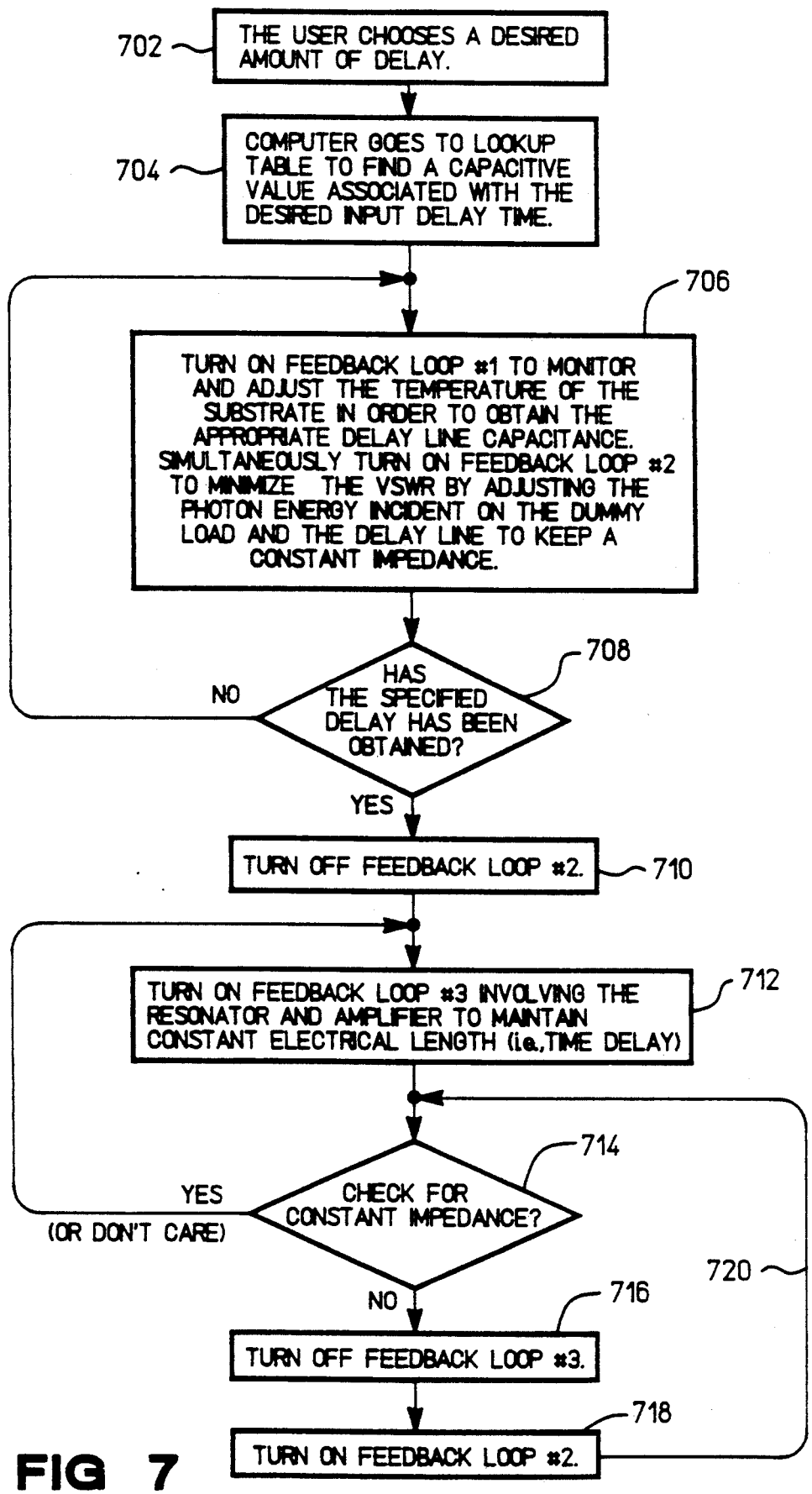
FIG. 7 is a flowchart showing a mode of operation in connection with the present invention.

One mode of operation of this invention is shown in FIG. 7. The user chooses a desired amount of delay at step 702. The computer goes to the look-up table to find a capacitive value associated with the desired input delay time as shown at 704. The temperature is varied and monitored by feedback loop #1 at step 706. During which time the reflectometer or VSWR meter is used to adjust the inductance of the dummy delay line to keep a constant impedance. This would utilize feedback loop #2.

A determination is made whether the delay has been achieved, as shown at conditional block 708. If the delay has not been achieved (i.e., the result is "NO"), the process loops back to the beginning of step 706 to adjust the capacitance and inductance of the trace.

If the result at conditional block 708 is "YES", feedback loop #2 is turned off, as shown in block 710. Feedback loop #3 involving the resonator 660 is the turned on and a constant electrical length (i.e., time delay) is maintained as shown at step 712.

The microprocessor or user may wish to periodically check for constant impedance. This condition is shown at 714. If the determination is "YES" or "DON'T CARE" the process loops up to the beginning of step 712 to adjust the impedance.

If the determination is "NO", the process turns off feedback loop #3, as shown at block 716, and feedback loop #2 is turned back on (see block 718). The penalty is that the delay time may "wander" somewhat from the desired value. The process then enters loop 720 and the user may decide to check the impedance at a later time.

Depending on the choice of the delay line length, the present invention can have a broad range of possible delay times. Furthermore, the use of feedback loops helps to control the electrical length (i.e., the delay time) and keep it fixed over relatively long intervals of time. Finally, since the superconductor is relatively low loss (as compared to copper at the same temperature), delay times can be made longer than that obtained in conventional delay lines.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

I claim:

1. A variable superconducting delay line system for providing a time delay for a signal applied to the system, the system permitting a user to select either a constant delay time for the applied signal propagating through the system, or a constant impedance value for the system, comprising:
   an insulative substrate having first and second surfaces oriented substantially parallel to one another;
   a superconducting transmission line comprising:
      (i) a high temperature superconducting trace on a first region of said first surface, said high temperature superconducting trace having an input end for receiving the applied signal and an output end for outputting the applied signal; and
      (ii) a conductive layer on said second surface to function as a ground plane for said superconducting transmission line;
   a capacitance control means coupled to said insulating substrate, for adjusting permittivity thereof to thereby control a capacitance C of said superconducting transmission line independently of an inductance L thereof;
   inductance control means coupled to said insulating substrate for adjusting permeability thereof to thereby control the inductance L of said superconducting transmission line independently of the capacitance C; and
   feedback control means for receiving:
      (i) a predetermined delay time for delaying the signal applied to said input; and
      (ii) one of:
         (a) a predetermined constant delay time for the signal propagating through said superconducting transmission line, and
         (b) a predetermined constant impedance value for said superconducting transmission line;
   said feedback control means coupled to said transmission line for monitoring the capacitance C and the inductance L and further coupled to said capacitance control means and said inductance control means for adjusting one of:
      (i) said capacitance control means and said inductance control means of said superconducting transmission line to obtain a product of $L \times C$ which maintains said predetermined constant delay time; and
      (ii) said capacitance control means and said inductance control means of said superconducting transmission line to obtain a ratio of $L/C$ which maintains said predetermined constant impedance value.

2. A method for providing a time delay to a signal applied to a variable superconducting delay line system, the system permitting a user to select either a constant delay time for the applied signal propagating through the system, or a constant impedance value for the system, the system comprising an insulative substrate having first and second surfaces oriented substantially parallel to one another, and a superconducting transmission line having permeability and permittivity and comprising (i) a high temperature superconducting trace on a first region of the first surface of the insulating substrate, the high temperature superconducting trace having an input end for receiving the applied signal and an output end for outputting the applied signal, and (ii) a conductive layer on the second surface to function as a ground plane for the superconducting transmission line, wherein the method comprises the steps of:
   (1) receiving:
      (a) a predetermined delay time for delaying the signal applied to the input, and
      (b) one of:
         (i) a predetermined constant delay time for the applied signal propagating through the superconducting transmission line, and
         (ii) a predetermined constant impedance value for the superconducting transmission line; and
   (2) based upon receiving one of the constant delay time and the constant impedance value, adjusting one of:
      (a) a capacitance control means and an inductance control means of the superconducting transmission line to obtain a product of $L \times C$ which maintains the predetermined constant delay time; and
      (b) a capacitance control means and an inductance control means of the superconducting transmission line to obtain a ratio of $L/C$ which maintains the predetermined constant impedance value;
   wherein step 2 is achieved by adjusting one of:
      (a) the permittivity of the insulating substrate to thereby control a capacitance C of the superconducting transmission line independently of an inductance L thereof, and
      (b) the permeability of the substrate to thereby control the inductance L of the superconducting transmission line independently of the capacitance C.

3. A variable superconducting delay line system for providing a time delay for a signal applied to the system, the system permitting a user to select either a constant delay time to the applied signal propagating through the system, or a constant impedance value for the system, comprising:
an insulative substrate having first and second surfaces oriented substantially parallel to one another;
a superconducting transmission line comprising:
(i) a high temperature superconducting trace on a first region of said first surface, said high temperature superconducting trace having an input end for receiving the applied signal and an output end for outputting the applied signal; and
(ii) a conductive layer on said second surface to function as a ground plane for said superconducting transmission line;
a capacitance control means coupled to said insulating substrate, for adjusting permittivity thereof to thereby control a capacitance C of said superconducting transmission line independently of an inductance L thereof, said capacitance control means having heater means for controlling temperature in said substrate and thereby change the capacitance C of the superconducting transmission line;
inductance control means coupled to said insulating substrate for adjusting permeability thereof to thereby control the inductance L of said superconducting transmission line independently of the capacitance C;
feedback control means for receiving:
(i) a predetermined delay time for delaying the signal applied to said input; and
(ii) one of:
(a) a predetermined constant delay time for the signal propagating through said superconducting transmission line, and
(b) a predetermined constant impedance value for said
superconducting transmission line; said feedback control means coupled to said transmission line for monitoring the capacitance C and the inductance L and further coupled to said capacitance control means and said inductance control means for adjusting one of:
(i) said capacitance control means and said inductance control means of said superconducting transmission line to obtain a product of L×C which maintains said predetermined constant delay time; and
(ii) said capacitance control means and said inductance control means of said superconducting transmission line to obtain a ratio of L/C which maintains said predetermined constant impedance value.

4. The system according to claim 3, wherein said capacitance control means further comprises:
a capacitor pad of high temperature superconducting material on a second region of said first surface of said insulating substrate for realizing a parallel plate capacitor with said conductive layer; and
capacitance monitoring means coupled to said capacitor pad and said heater means for monitoring capacitance of said pad, and for adjusting said heater means to change the temperature of said substrate and thereby change the capacitance of said superconducting transmission line to maintain one of said constant delay time and said constant impedance value.

5. The system according to claim 4, wherein said inductance control means further comprises:
inductance monitoring means located on and coupled to said insulating substrate for monitoring the inductance L of said superconducting transmission line; and
a photon source means, responsive to said inductance monitoring means, for controlling emission of photon energy onto said superconducting transmission line to maintain one of said constant delay time and said constant impedance value.

6. The system according to claim 5, wherein said inductance monitoring means further comprises means for monitoring reflections in a dummy superconducting delay line, said means for monitoring located at a third region of said first surface of said insulating substrate and being terminated by a load resistor of predetermined value, and wherein said means for monitoring operates to maintain said constant impedance value by minimizing reflections in said dummy superconducting delay line by generating control signals to control said photon source means to thereby control said emission of photon energy onto said superconducting transmission line, said photon energy also being incident on said dummy superconducting delay line to adjusts the impedance thereof.

7. The system according to claim 5, wherein said inductance monitoring means further comprises:
a superconducting resonator having a predetermined length and located at a third region on said first surface of said substrate;
an amplifier means coupled to said superconducting resonator to realize an oscillator having a resonant frequency defined by said length of said superconducting resonator; and
a frequency counter coupled to said oscillator to sample a frequency produced thereby and to output a feedback signal to control said photon source means;
wherein said photon source means controls said emission of photon energy onto said superconducting transmission line and said superconducting resonator to keep the resonant frequency constant and thereby maintain said constant delay time.

8. The system according to claim 5, wherein said feedback means further comprises means to switch between maintaining said constant time delay and monitoring said constant impedance value.

9. The system according to claim 4, wherein said inductance control means further comprises:
inductance monitoring means located on and coupled to said insulating substrate for monitoring the inductance of said superconducting transmission line; and
injection means, responsive to said inductance monitoring means, for controlling the injection of quasi-particles into said superconducting transmission line to maintain one of said constant delay time and said constant impedance value.

10. The system according to claim 9, wherein said inductance monitoring means further comprises means for monitoring reflections in a dummy superconducting delay line located at a third region of said first surface of said insulating substrate terminated by a load resistor of predetermined value, wherein said means for monitoring operates to maintain said constant impedance value by minimizing reflections in said dummy superconducting delay line by generating control signals to control said injection means to thereby control said injection of quasiparticles into said superconducting transmission line, said quasiparticles also being injected into said dummy superconducting delay line to adjusts the impedance thereof.

11. The system according to claim 9, wherein said inductance monitoring means further comprises:
a superconducting resonator having a predetermined length, said superconducting resonator located at a third region on said first surface of said substrate;
an amplifier means coupled to said superconducting resonator, said amplifier means and said superconducting resonator thereby realizing an oscillator having a resonant frequency defined by said length of said superconducting resonator;
a frequency counter coupled to said oscillator to sample a frequency produced thereby and output a feedback signal to control said photon source means; and
wherein said injection means controls said injection of quasiparticles into said superconducting transmission line and said superconducting resonator to keep the resonant frequency constant and thereby maintain said constant delay time.

12. The system according to claim 9, wherein said feedback means further comprises means to switch between maintaining said constant time delay and monitoring said constant impedance value.

13. A method for providing a time delay to a signal applied to a variable superconducting delay line system, the system permitting a user to select either a constant delay time for the applied signal propagating through the system, or a constant impedance value for the system, the system comprising an insulative substrate having first and second surfaces oriented substantially parallel to one another, and a superconducting transmission line having permeability and permittivity and comprising (i) a high temperature superconducting trace on a first region of the first surface of the insulating substrate, the high temperature superconducting trace having an input end for receiving the applied signal and an output end for outputting the applied signal, and (ii) a conductive layer on the second surface to function as a ground plane for the superconducting transmission line, wherein the method comprises the steps of:
(1) receiving:
  (a) a predetermined delay time for delaying the signal applied to the input, and
  (b) one of:
    (i) a predetermined constant delay time for the applied signal propagating through the superconducting transmission line, and
    (ii) a predetermined constant impedance value for the superconducting transmission line; and
(2) based upon receiving one of the constant delay time and the constant impedance value, applying one of:
  (a) heat to the insulating substrate to thereby control capacitance C of the superconducting transmission line independently of inductance L thereof, and thereby maintain said predetermined constant delay time; and
  (b) photon energy to the superconducting transmission line to thereby control the inductance L independently of the capacitance C, and thereby maintain said predetermined constant impedance value.

14. A method for providing a time delay to a signal applied to a variable superconducting delay line system, the system permitting a user to select either a constant delay time for the applied signal propagating through the system, or a constant impedance value for the system, the system comprising an insulative substrate having first and second surfaces oriented substantially parallel to one another, and a superconducting transmission line having permeability and permittivity and comprising (i) a high temperature superconducting trace on a first region of the first surface of the insulating substrate, the high temperature superconducting trace having an input end for receiving the applied signal and an output end for outputting the applied signal, and (ii) a conductive layer on the second surface to function as a ground plane for the superconducting transmission line, wherein the method comprises the steps of:
(1) receiving:
  (a) a predetermined delay time for delaying the signal applied to the input, and
  (b) one of:
    (i) a predetermined constant delay time for the applied signal propagating through the superconducting transmission line, and
    (ii) a predetermined constant impedance value for the superconducting transmission line; and
(2) based upon receiving one of the constant delay time and the constant impedance value, one of:
  (a) applying heat to the insulating substrate to thereby control capacitance C of the superconducting transmission line independently of inductance L thereof, and thereby maintain said predetermined constant delay time; and
  (b) injecting quasiparticles into the superconducting transmission line to thereby control the inductance L independently of the capacitance C, and thereby maintain said predetermined constant impedance value.

15. A variable superconducting delay line system for providing a time delay for a signal applied to the system, the system permitting a user to select either a constant delay time to the applied signal propagating through the system, or a constant impedance value for the system, comprising:
an insulative substrate having first and second surfaces oriented substantially parallel to one another;
a superconducting transmission line comprising:
  (i) a high temperature superconducting trace on a first region of said first surface, said high temperature superconducting trace having an input end for receiving the applied signal and an output end for outputting the applied signal; and
  (ii) a conductive layer on said second surface to function as a ground plane for said superconducting transmission line;
a capacitance control means coupled to said insulating substrate, for adjusting permittivity thereof to thereby control a capacitance C of said superconducting transmission line independently of an inductance L thereof;
inductance control means coupled to said insulating substrate for adjusting permeability thereof to thereby control the inductance L of said superconducting transmission line independently of the capacitance C, said inductance control means having inductance monitoring means for monitoring the inductance L of said superconducting transmission line and a photon source means, responsive to said inductance monitoring means, for controlling emission of photon energy onto said superconducting the transmission line to maintain one of said constant delay time and said constant impedance value;

feedback control means for receiving:
(i) a predetermined delay time for delaying the signal applied to said input; and
(ii) one of:
  (a) a predetermined constant delay time for the signal propagating through said superconducting transmission line, and
  (b) a predetermined constant impedance value for said superconducting transmission line;

said feedback control means coupled to said transmission line for monitoring the capacitance C and the inductance L and further coupled to said capacitance control means and said inductance control means for adjusting one of:
(i) said capacitance control means and said inductance control means of said superconducting transmission line to obtain a product of LxC which maintains said predetermined constant delay time; and
(ii) said capacitance control means and said inductance control means of said superconducting transmission line to obtain a ratio of L/C which maintains said predetermined constant impedance value.

* * * * *

UNITED STATES PATENT AND TRADEMARK OFFICE
CERTIFICATE OF CORRECTION

PATENT NO. : 5,208,213
DATED : May 4, 1993
INVENTOR(S) : Richard C. Ruby It is certified that error appears in the above-identified patent and that said Letters Patent is hereby corrected as shown below:

Column 4, line 64, change "ground." to --ground.)--;

Column 5, line 27, change "SrTiCO$_3$" to --SrTiO$_3$--;

Column 5, line 39, change "SrTiCO$_3$" to --SrTiO$_3$--;

Column 5, line 61, change "(ZO)" to --(Z$_0$)--;

Column 7, line 5, change "SrTiCO$_3$" to --SrTiO$_3$--.

Signed and Sealed this

Eighth Day of March, 1994

*Attest:*

BRUCE LEHMAN

*Attesting Officer*     *Commissioner of Patents and Trademarks*